United States Patent [19]

Shimizume

[11] Patent Number: 5,528,608
[45] Date of Patent: Jun. 18, 1996

[54] DE-INTERLEAVE CIRCUIT FOR REGENERATING DIGITAL DATA

[75] Inventor: Kazutoshi Shimizume, Kanagawa, Japan

[73] Assignee: Sony Corporation, Tokyo, Japan

[21] Appl. No.: 419,508

[22] Filed: Apr. 7, 1995

Related U.S. Application Data

[63] Continuation of Ser. No. 44,491, Apr. 9, 1993, abandoned.

[30] Foreign Application Priority Data

Apr. 13, 1992 [JP] Japan ..................... 4-119798

[51] Int. Cl.⁶ .......................... G06F 11/00; H03M 13/00
[52] U.S. Cl. ............................ 371/40.3; 371/2.1
[58] Field of Search ................ 371/2.1, 2.2, 37.1, 371/37.2, 37.4, 37.5, 40.1, 40.3, 44, 45, 51.1; 375/80, 243, 245

[56] References Cited

U.S. PATENT DOCUMENTS

| | | | |
|---|---|---|---|
| Re. 33,462 | 11/1990 | Suzuki et al. | 371/39.1 |
| 4,355,392 | 10/1982 | Doi et al. | 371/45 |
| 4,394,642 | 7/1983 | Currie et al. | 371/40.1 |
| 4,433,415 | 2/1984 | Kojima | 371/38.1 |
| 4,437,185 | 3/1984 | Sako et al. | 371/39.1 |
| 4,459,696 | 7/1984 | Kojima | 371/38.1 |
| 4,497,058 | 1/1985 | Sako et al. | 371/39.1 |
| 4,546,474 | 10/1985 | Sako et al. | 371/40.1 |
| 4,577,319 | 3/1986 | Takeuchi et al. | 371/38.1 |
| 4,598,403 | 7/1986 | Odaka | 371/39.1 |
| 4,710,923 | 12/1987 | Nagumo | 371/39.1 |
| 4,862,297 | 8/1989 | Fukami et al. | |
| 4,916,701 | 5/1990 | Eggenberger et al. | 371/37.7 |
| 4,949,342 | 8/1990 | Shimbo et al. | 371/39.1 |
| 4,977,550 | 12/1990 | Furuya et al. | 369/32 |
| 5,051,998 | 9/1991 | Mural et al. | 371/39.1 |
| 5,210,760 | 5/1993 | Bentley et al. | 371/38.1 |
| 5,216,677 | 6/1993 | Takagi et al. | 371/40.3 |
| 5,222,069 | 6/1993 | Chevalley | 371/40.3 |
| 5,231,638 | 7/1993 | Fujiki | 371/40.3 |
| 5,255,272 | 10/1993 | Gill et al. | 371/40.3 |
| 5,369,652 | 11/1994 | Bailey et al. | 371/40.1 |

FOREIGN PATENT DOCUMENTS

| | | | |
|---|---|---|---|
| 0086566 | 8/1982 | European Pat. Off. | |
| 0235782 | 9/1987 | European Pat. Off. | |
| 0472415 | 2/1992 | European Pat. Off. | |
| 128011 | 7/1983 | Japan | G11B 5/09 |
| 61-94474 | 5/1986 | Japan | H04N 5/782 |
| 243729 | 9/1989 | Japan | H03M 13/00 |
| 205659 | 9/1991 | Japan | G10H 1/00 |

OTHER PUBLICATIONS

Geurts et al. "An Intelligent Memory Controller For Dynamic Data Structures" IEEE 1989 pp. 35–37.

Primary Examiner—Robert W. Beausoliel, Jr.
Assistant Examiner—Albert Décady
Attorney, Agent, or Firm—Hill, Steadman & Simpson

[57] ABSTRACT

In a digital data regenerating apparatus for regenerating digital data, while correcting errors in the data, which is formed of a predetermined number of words corresponding to 1 frame and input in parallel, a de-interleave circuit comprises a demodulator circuit for demodulating digital data, a buffer RAM for temporarily storing demodulated output data output from the demodulator circuit, an error correcting circuit for receiving data from the buffer RAM through an input circuit, a microprogram sequencer, and a pointer setting circuit controlled by the microprogram sequencer. An error correcting flag is correspondingly set up for each set of data formed of a plurality of words and, in a plurality of operating modes in which an error correcting flag is attached to each set of different data, the addresses for setting data to the pointers are made different such that error correction is achieved by the use of a common microprogram in the plurality of operating modes.

10 Claims, 7 Drawing Sheets

| D7 | D6 | D5 | D4 | D3 | D2 | D1 | D0 |
|----|----|----|----|----|----|----|----|
|    |    |    |    |    |    | Wx,B | Wx,A |

UNUSED (D7–D2)

| DATA AFTER C2 CORRECTION | C2 POINTER ADDRESS | |
|---|---|---|
| W12n, A<br>W12n, B | 1 (A<br>A | A<br>A |
| W12n+1, A<br>W12n+1, B | 2 (B<br>B | A<br>A |
| W12n+2, A<br>W12n+2, B | 3 (C<br>C | A<br>A |
| W12n+3, A<br>W12n+3, B | 4 (D<br>D | A<br>A |
| W12n+4, A<br>W12n+4, B | 5 (E<br>E | B<br>B |
| ⋮ | ⋮ | ⋮ |
| W12n+11, A<br>W12n+11, B | 12 (L<br>L | F<br>F |
| | (CD) | (MD) |

FIG. 5

|  |  |  | (RAM ADDRESS) | |
|---|---|---|---|---|
|  |  |  | CD | MD |
| Read | C1 POINTER | $W_{12n}$, A | | |
| Read | C1 POINTER | $W_{12n}$, B | | |
| Write | C2 POINTER | $W_{12n}$ | A | A |
| Read | C1 POINTER | $W_{12n+1}$, A | | |
| Read | C1 POINTER | $W_{12n+1}$, B | | |
| Write | C2 POINTER | $W_{12n+1}$ | B | A |
| Read | C1 POINTER | $W_{12n+2}$, A | | |
| Read | C1 POINTER | $W_{12n+2}$, B | | |
| Write | C2 POINTER | $W_{12n+2}$ | C | A |
| Read | C1 POINTER | $W_{12n+3}$, A | | |
| Read | C1 POINTER | $W_{12n+3}$, B | | |
| Write | C2 POINTER | $W_{12n+3}$ | D | A |

FIG. 6

DB01(LSB) BS01      DB07(MSB) BS07

| $W_{12n+3}$, B | $W_{12n+3}$, A | $W_{12n+2}$, B | $W_{12n+2}$, A | $W_{12n+1}$, B | $W_{12n+1}$, A | $W_{12n}$, B | $W_{12n}$, A |
|---|---|---|---|---|---|---|---|
| $W_{12n+7}$, B | $W_{12n+7}$, A | $W_{12n+6}$, B | $W_{12n+6}$, A | $W_{12n+5}$, B | $W_{12n+5}$, A | $W_{12n+4}$, B | $W_{12n+4}$, A |
| $W_{12n+11}$, B | $W_{12n+11}$, A | $W_{12n+10}$, B | $W_{12n+10}$, A | $W_{12n+9}$, B | $W_{12n+9}$, A | $W_{12n+8}$, B | $W_{12n+8}$, A |

DE-INTERLEAVE CIRCUIT FOR REGENERATING DIGITAL DATA

This is a continuation of application Ser. No. 08/044,491 filed Apr. 9, 1993, now abandoned.

BACKGROUND OF THE INVENTION

1. Field of the Invention

The present invention relates to a de-interleave circuit and, more particularly, to a de-interleave circuit suitable for use in a digital data regenerating apparatus of a disk player capable of playing back a digital audio disk called a minidisk.

2. Description of the Related Art

Compact disks (hereinafter called "CD") are widely spread as digital audio disk providing high quality of sound. Recently, however, a minidisk (hereinafter called "MD") which is much smaller than CD in size and yet is comparable to the CD in playback time because of its having its data recorded through data compression has been developed and is being put into practice.

The MD player is employing a magnetooptic recording system. Further, the interleave method used in the MD system is adapted to facilitate "waveform joining" and provide an interleave effect equal to that obtainable in the CD system.

The sequence of de-interleave in the MD system is shown in FIG. 9. On the left of FIG. 9, there are shown the data for 1 frame regenerated from the disk. The data regenerated at the start of the frame following the subcode is the 8-bit data $W12_n$, A. The data generated next is the data $W12_n$, B.

In the above, n represents the frame number, $P_n$ represents the C1 parity, and $Q_n$ represents the C2 parity. Of the numerals enclosed with the rectangle, "1" represents a delay of 1 frame and "27D" represents a delay of 108 frames (D=4).

The C1 correction is applied to the data $W12_n$, A, $W12_n$, B obtained 1 frame before, $W12_{n+1}$, A, $W12_{n+1}$, B obtained 1 frame before, ..., in order of mention and one coded word is provided by the data of 32 bytes. When correction cannot be achieved by the process of C1 correction (multiple error), C1 flags (C1 pointers) are set up for the 32 bytes of the C1. When the RAM used is that having a data width of 8 bits, only 1 bit out of them is used as the C1 flag.

The C2 correction is applied to the data $W12_n$, A obtained 108 frames before, $W12_n$, B obtained 105 frames before, ..., in order of mention and one coded word is provided by the data of 28 bytes. In the process of the C2 correction, the C1 flag is utilized for calculation of the C2 error correction to thereby prevent false correction or utilized for erasure correction.

Further, in most cases where error correction has been unachievable by the C2 correction, the C1 flag of each data is used. More specifically, when there is set up a C1 flag, a C2 pointer (C2 flag) is set up as the error data. The C2 pointer is attached to each 8-bit data to be paired therewith.

When one C2 pointer (1 byte) is assigned to one data as described above, number of bytes calculated as under are required as the necessary space of the buffer RAM for error correction:

(1) From writing RF signal to C1 correction: 32+16=48 bytes, (2) From C1 correction to the C2 correction: 27D+26D+ ... +3D+2D+1D+27D=1,620 bytes, where the last 27D is those for the C1 pointers, (3) From the C2 correction to D/A outputting
{(27D+26D+ ... +2D+1D)+12}+{(27D+26D+ ... +2D+1D)+12}=2,616 bytes, where the first half in parentheses "{ }" is for the data and the second half in parentheses is for the C2 pointers, while 12D to 15D, which are related to the parity Q, can be omitted.

From (1)+(2)+(3) above, 4,284 bytes become necessary as the space of the buffer RAM. Namely, as the total capacity, 34,272 bits are required of the buffer RAM.

In the EFM (Eight to Fourteen Modulation) demodulation of the CD player, 1 byte for the C2 pointer has been used for 2 bytes of data which have undergone the C2 correction in the error correction. Further, the interval between the C2 correction and the outputting of the data to the D/A converter has been less than 2 frames and, hence, the capacity has been enough if it can retain the C2 pointers only for a period of time less than two frames. Therefore, there has not been a big problem with CD players.

In the de-interleave in the MD player, however, the C2 pointer has to be retained 109 (=27D+1) frames at the maximum and the memory space of 34,272 bits is required of the error correcting RAM as described above. Accordingly, a 32K-bit buffer RAM was insufficient in capacity and a 64K-bit buffer RAM has to be used.

SUMMARY OF THE INVENTION

The present invention has been made in view of the above described problem and it is an object of the present invention to provide a de-interleave circuit which is applicable to de-interleaving in the MD system, while it is realized with the use of a 32K-bit buffer RAM, and, in addition, capable of using the error correcting program in common with the CD system.

In a digital data regenerating apparatus for regenerating digital data, while correcting errors in the data, which is formed of a predetermined number of bytes corresponding to 1 frame and input in parallel, a de-interleave circuit according to the present invention is arranged such that error correcting flags in one word are correspondently set up for the data of a plurality of words and C2 pointers are set up while the addresses to be set to the C2 pointers are made different in the CD mode and in the MD mode, and thus error correction is made possible by using a common microprogram in both the modes and the capacity for the error correcting flags (C2 pointers) in the C2 correction in the MD mode is made smaller than in the CD mode.

BRIEF DESCRIPTION OF THE DRAWINGS

FIG. 5 is a diagram showing the microprogram of a pointer copying portion in the CD mode;

FIG. 6 is a diagram showing structure of the C2 pointers in the MD system;

DETAILED DESCRIPTION OF THE PREFERRED EMBODIMENTS

An embodiment of the present invention will be described below with reference to the accompanying drawings.

Figure 1:
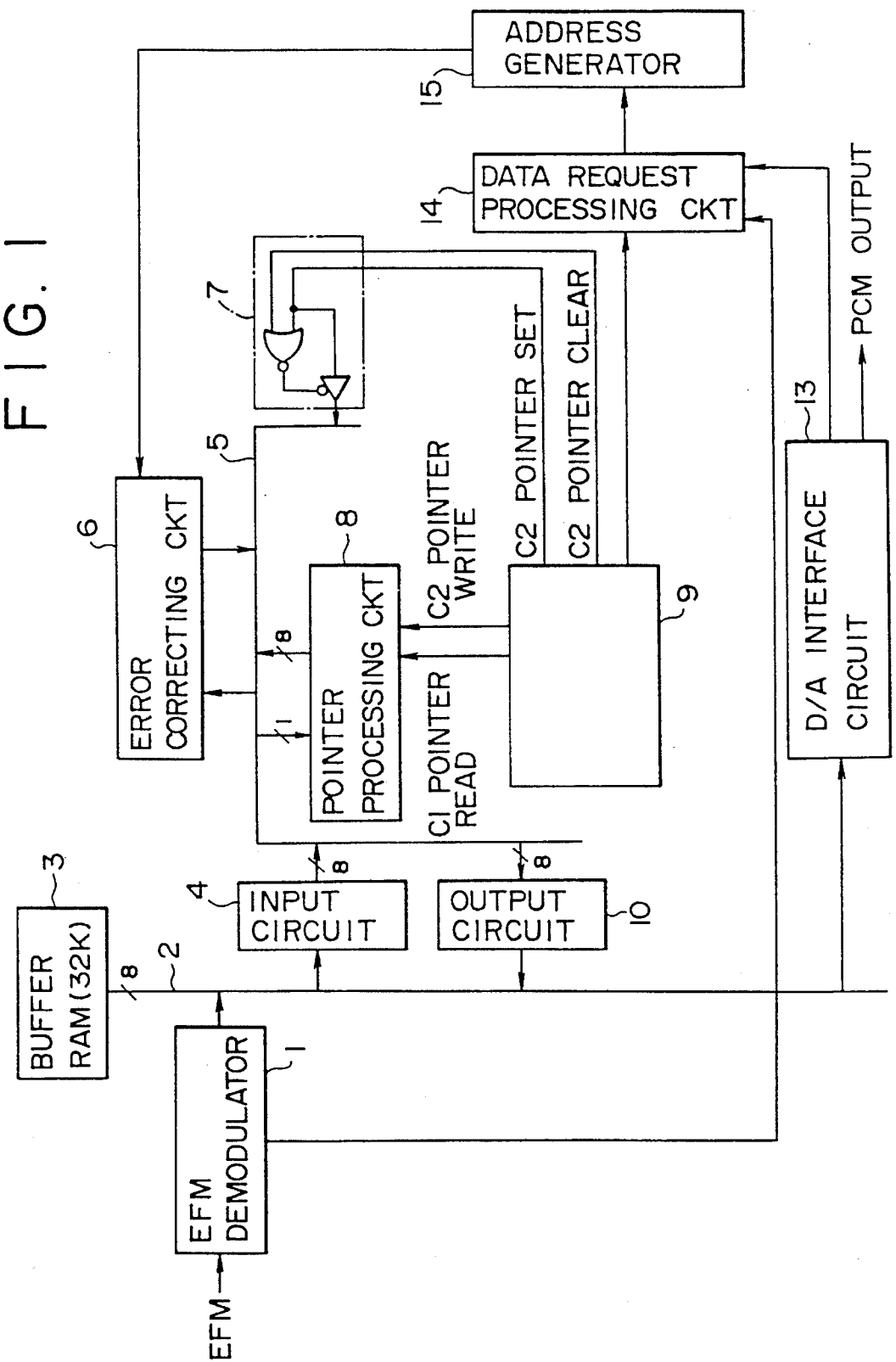
FIG. 1 is a block diagram showing an embodiment of the present invention.

FIG. 1 is a block diagram showing the arrangement of a circuit for regenerating digital data to which a de-interleave circuit according to the present invention is applied. Referring to the diagram, an EFM signal read from an MD is EFM demodulated in an EFM demodulator circuit 1. PCM audio data as the demodulated output, i.e., data of 8 bits (one symbol in parallel) is recorded in a buffer RAM 3 of 32K bits through an external bus 2.

The RAM 3 functions as a buffer for de-interleaving the CIRC (Cross Interleave Read Solomon Code) and the related error connection.

Figure 9:
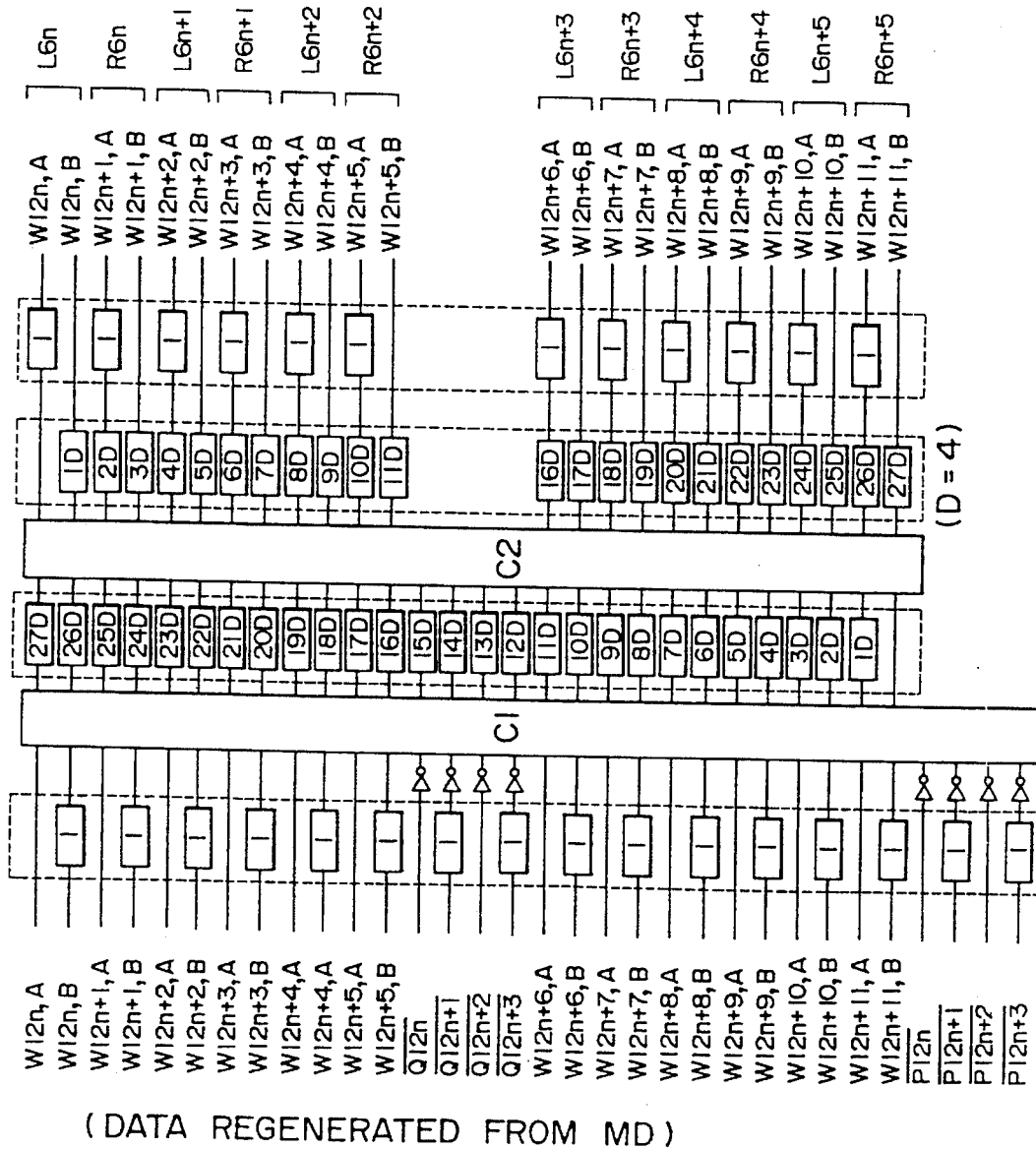
FIG. 9 is a diagram showing the sequence of de-interleave in the MD system.

The de-interleaved C1 and C2 data of 32 symbols and 28 symbols, respectively, are input through an input circuit 4 to be supplied to an error correcting circuit 6 through an internal bus 5. The sequence of the data in this stage is as shown in FIG. 9.

In the C2 correction, pointers are set up for uncorrected information. When error correction was not achieved in the C2 correction because of existence of a multiple error, the C1 pointers are copied. When, in the C2 correction, it is strongly possible that an undetected error was made in the C1 correction, C2 pointers are established for the whole of the C2 information (hereinafter called "all pointer").

For setting up the C2 pointer, a C2 pointer setting circuit 7 and a pointer processing circuit 8 are provided, each being connected to the internal bus 5. The C2 pointer setting circuit 7 and the pointer processing circuit 8 are adapted to be controlled by a microprogram sequencer 9.

More specifically, when an all pointer instruction is executed by the microprogram sequencer 9, pointers "1" for all of the 8 bits are set by the C2 pointer setting circuit 7 in the internal bus 5 upon issuance of the C2 pointer setting instruction from the microprogram sequencer 9 and then the pointers are set, through an output circuit 10, in the external bus (data bus) 2 connected with the RAM 3.

Figures 2, 3:
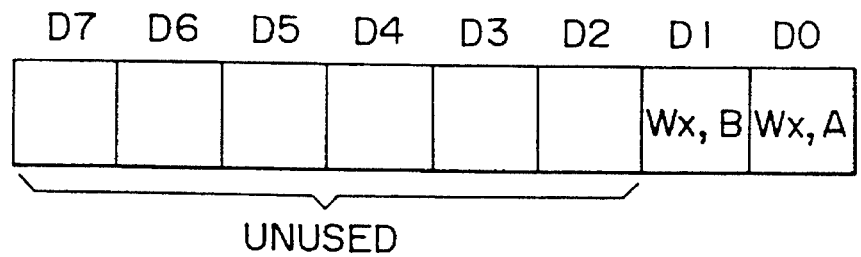
FIG. 2 is a diagram showing structure of the C2 pointer in the CD system.
FIG. 3 is a diagram showing relationships between the data which have undergone the C2 correction and addresses of the C2 pointers in the CD and MD systems.

In a player of the CD, it is arranged such that C2 pointers in 1 byte are written for the data of 2 bytes which have undergone the C2 correction as shown in FIG. 2. In this case, as apparent from FIG. 2, high order six bits are left unused.

In order to make the circuit usable in common in the CD system and the MD system, it is arranged in the present invention such that the same microprogram is used for both the MD and the CD and only the RAM addresses for the C2 pointers are made different.

More specifically, while C2 pointers are written 12 times for the data of 24 bytes in the CD mode as shown in FIG. 3, C2 pointers are written at the same address four times over in the MD mode. Therefore, the microprogram can be used in common.

As described above, when the C2 correction is unachievable because there is a multiple error, the C1 pointer is copied as the C2 pointer if the C1 correction is considered to have been correctly made.

When the copying instruction is issued from the microprogram sequencer 9, the pointer processing circuit 8 operates under a C1 pointer read instruction and a C2 pointer write instruction issued by the microprogram sequencer 9.

Figure 4:
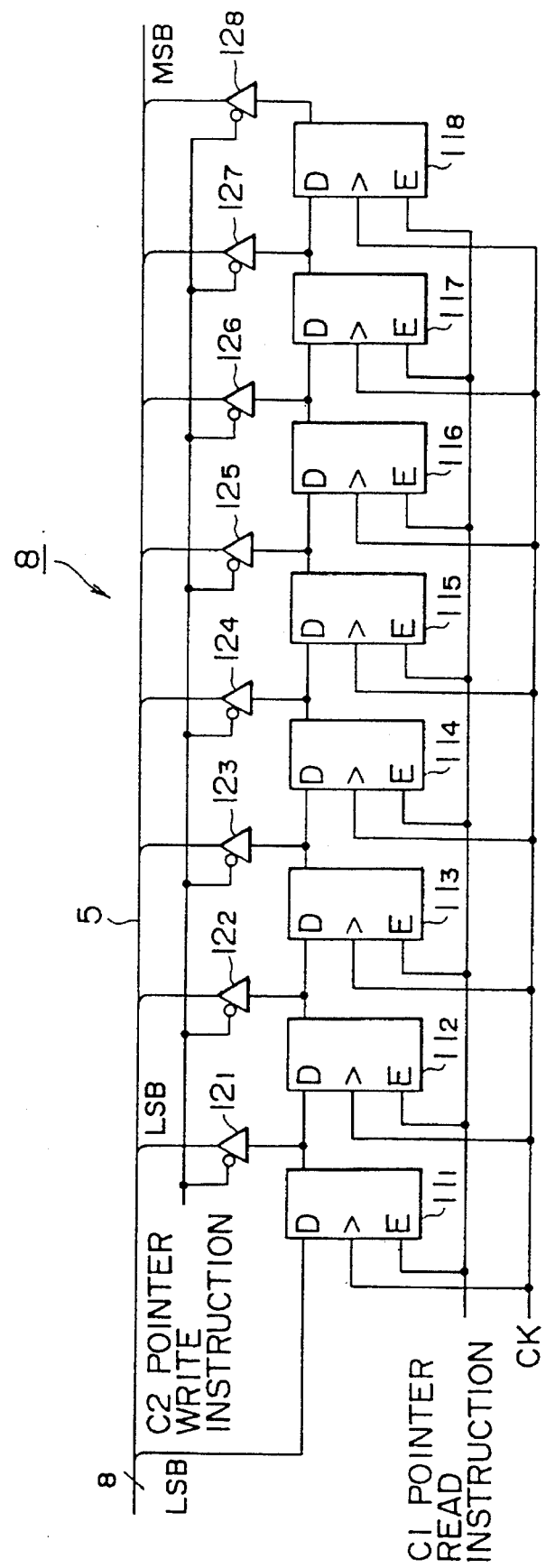
FIG. 4 is a block diagram showing an example of structure of a pointer processing circuit.

In the pointer processing circuit 8, there are connected in series 8-bit D-FF (flip-flops) $11_1$ to $11_8$ with the enable terminal (E) as shown in FIG. 4. The D-FF $11_1$ to $11_8$ use the C1 pointer read instruction as the enable input. The flip-flop D-FF $11_1$ in the first stage receives the LSB (least significant bit) of the C1 pointer supplied from the internal bus 5 as the data (D) input.

Between the output terminals of the flip-flops D-FF $11_1$ to $11_8$ and the internal bus 5, there are connected buffers $12_1$ to $12_8$ to be rendered active by the C2 pointer write instruction.

After the C1 correction has been carried out, the C1 pointer is written only in the LSB. The microprogram at the pointer copying portion in the CD mode is as shown in FIG. 5. More specifically, the operation reading the C1 pointer two times and writing the C2 pointer one time is repeated.

In the CD mode, only the two LSBs are used for writing the C2 pointer as shown in FIG. 2, and therefore it offers no problem whatever may be put in the higher 6 bits.

In the MD mode, by overwriting the write address for one C2 pointer four times, there are finally completed 3 bytes of 8-bit C2 pointers for the data of 24 bytes as shown in FIG. 6.

Giving a summary of the above described sequence of operations, a C2 pointer arranged in 8 bits is first recorded as a set of the data in the RAM. Namely, 1 byte of the C2 pointer is assigned to the 8 bytes of the data $W12_n$, A to $W12_{n+3}$, B. The C2 pointer remains recorded in the RAM 3 for a period of 7D.

Then, another C2 pointer arranged in 1 byte for the data $W12_{n+4}$, A to $W12_{n+7}$, B is retained in the RAM 3 for a period of 19D. Finally, a third C2 pointer arranged in 1 byte for the data $W12_{n+8}$, A to $W12_{n+11}$, B is retained in the RAM 3 for a period of 27D.

By assigning 8 bits of the C2 pointer after the C2 correction to 8-byte information as described above, the capacity for the C2 pointers becomes $$7D+19D+27D=212 \text{ bytes.}$$

Namely, it has become ¼ of that in the past. The total capacity of the buffer RAM 3, in contrast to (1) to (3) above, becomes $$48+1,620+1,296+12+212=3,188 \text{ bytes.}$$

Namely, by the decrease of the capacity for the C2 pointers to ¼ of that in the past, it has become possible to achieve the de-interleave with the use of a 32K-bit RAM and, further, even when the 32K-bit RAM is used, from $$\{(32\times1,024)/8\}-3,188=908,$$

the capacity for 908 bytes is left behind and this will be used as frame jitter margin.

Also, since it has been arranged in the MD mode such that the C2 pointer is written at the same address four times over, while, in the CD mode, C2 pointers are written 12 times for the data of 12 bytes as described in FIG. 3, it is made possible to use the error correcting program in common with the CD mode.

Referring back to FIG. 1, PCM audio information, after error correction, is supplied to a D/A interface circuit 13 through the external bus 2 and subjected, therein, to interpolation, parallel/serial conversion, and so on.

A data request processing circuit 14 is provided for receiving requests from several reading/writing circuits for allocation of storage location of the buffer RAM 3. More specifically, when the error correcting circuit 6 uses the buffer RAM 3, the error correcting circuit 6 outputs the request to the data request processing circuit 14. Other than that, write requests or read requests from the D/A interface circuit 13 and the EFM demodulator circuit 1 are input to the data request processing circuit 14. When two or more requests arrive simultaneously, one out of them is accepted according to predetermined priority. Then, at the request, an address generator circuit 15 generates a real address in the buffer RAM 3.

Since the data for which a C2 pointer is set up is error data which has not been corrected even by the C2 correction, the D/A interface circuit 13 performs such operation as interpolation, namely, it obtains and outputs the average value of the correct data before and after the error data.

In order to carry out the interpolation, it is required to read the C2 pointer. An example of arrangement of the read circuit for reading the C2 pointer is shown in FIG. 7.

Circuit operation of the C2 pointer reading circuit will be described below with reference to a timing chart of FIG. 8.

Figure 7:
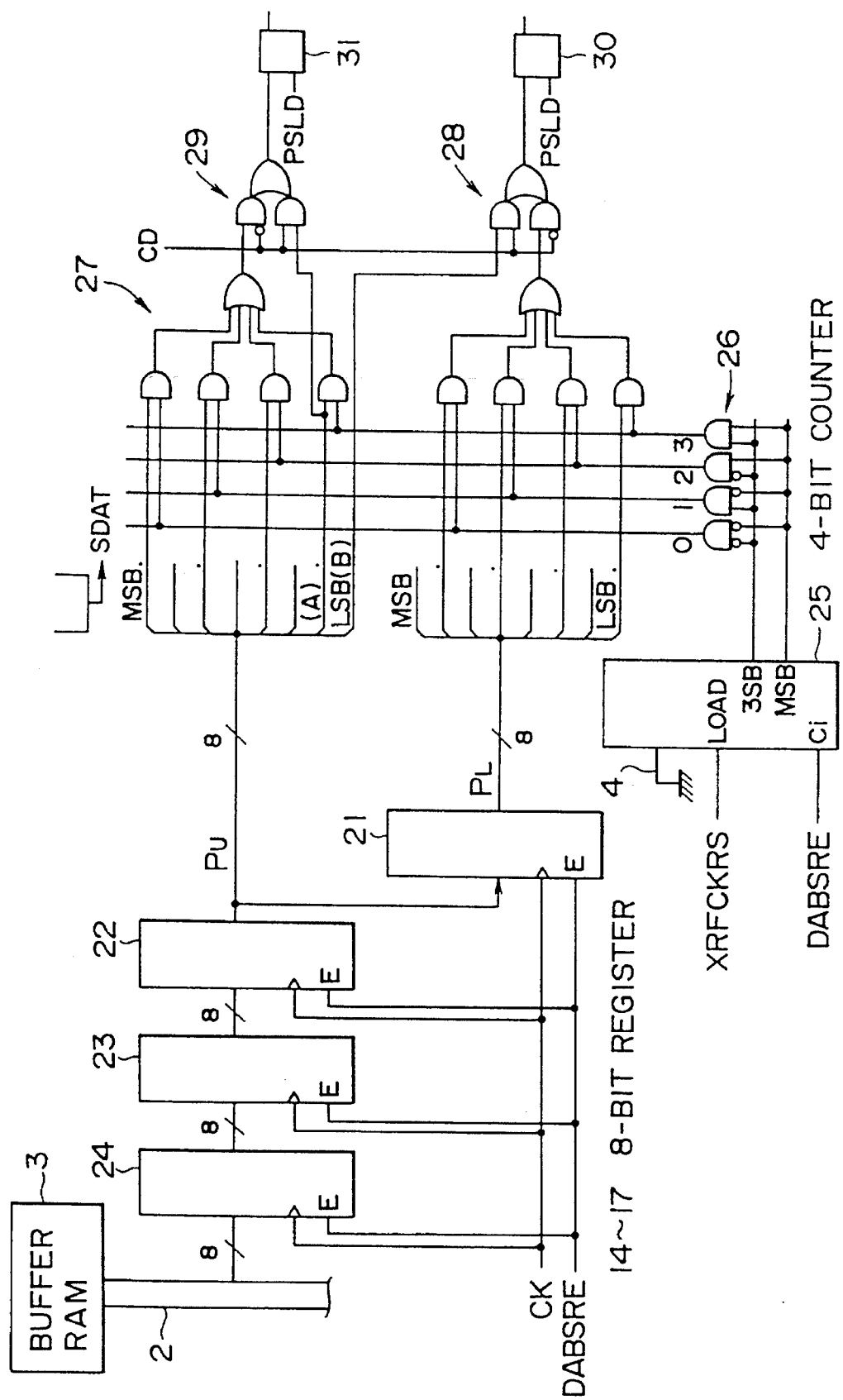
FIG. 7 is a diagram showing an example of structure of a C2 pointer read circuit.

Referring to FIG. 7, on the data bus 2 of the buffer RAM 3, a C2 pointer and the data which has undergone error correction after de-interleaving are placed while a timing pulse DABSRE is at high level.

Figure 8:
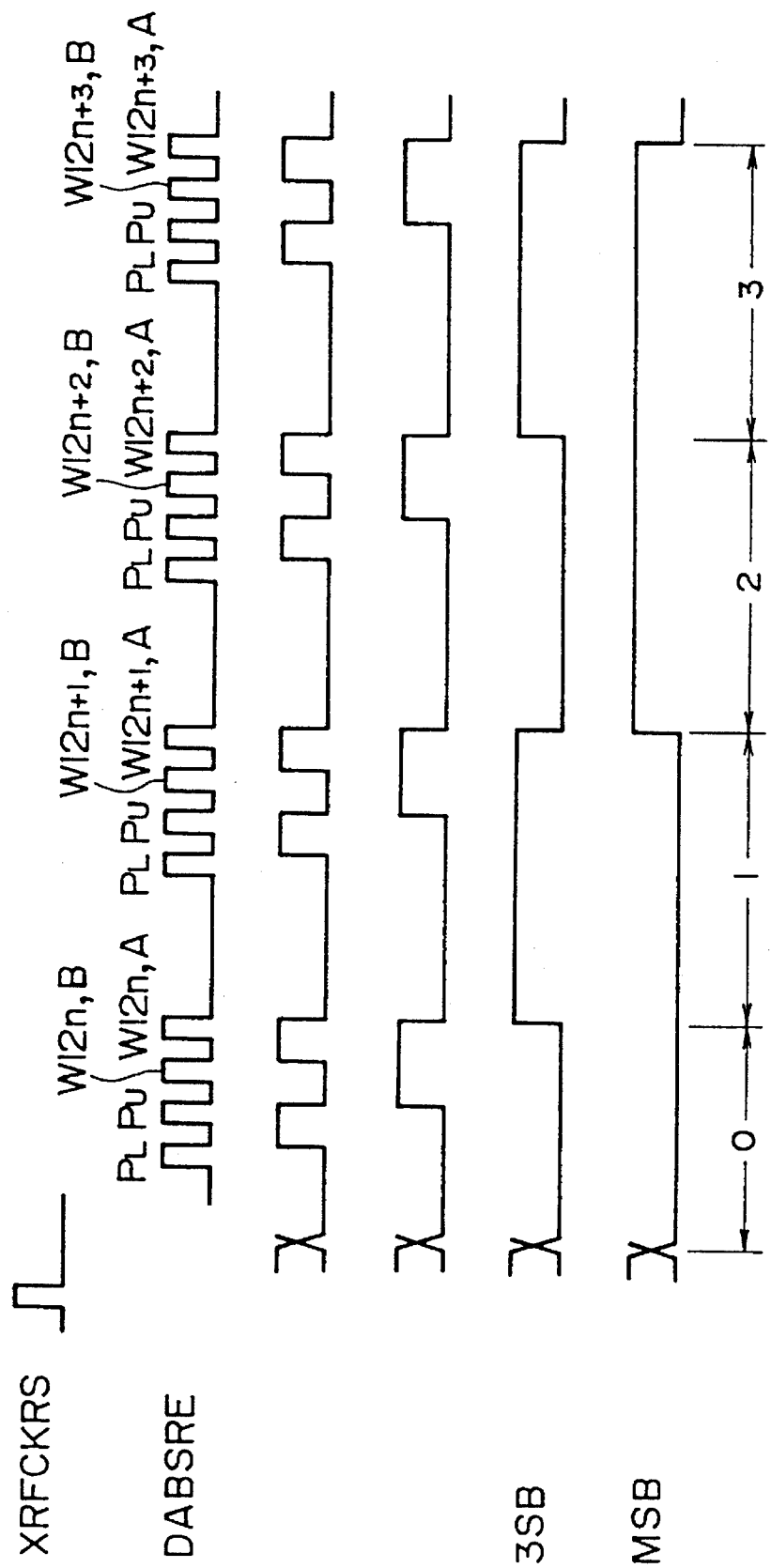
FIG. 8 is a diagram showing a timing chart of the C2 pointer read.

In the MD mode, the timing pulse DABSRE has four pulses in a set as shown in FIG. 8, and the pointer $P_L$ (low order), pointer $P_u$ (high order), data $W_x$, B (low order), and data $W_x$, A (high order) are placed on the data bus 2 in order of mention in accordance with the four pulses.

The above data are stored into four 8-bit registers 21 to 24 having the timing pulse DABSRE as the enable (E) input. The register 21 functions as that for the low-order pointer $P_L$ and the register 22 functions as that for the high-order pointer $P_U$.

There is provided a 4-bit counter 25 making a counting operation in synchronism with the fall of the timing pulse DABSRE. This counter 25 loads (0, 0, 0, 0) therein responding to the timing pulse XRFCKRS generated at the head of the frame. Relationships between the count value of the counter 25 and the timing pulse DABSRE are shown in the timing chart of FIG. 8.

Four states 0 to 3 are generated by a gate circuit 26 based on the high-order 2 bits (MSB, 3SB) in the counter 25 and the pair of 2-byte data ($W_x$, B, $W_x$, A).

Then, in the matrix circuit 27, the pointer corresponding to the 2-byte data is selected according to the count value of the counter 25 from among the 8-bit C2 pointers stored in the registers 21 and 22.

The low-order pointer $P_L$ selected from the C2 pointers in the register 21 is passed through a gate circuit 28 and latched by a latch circuit 30, while the high-order pointer $P_U$ selected from the C2 pointers in the register 22 is passed through a gate circuit 29 and latched by a latch circuit 31.

Meanwhile, in the CD mode, the timing pulse DABSRE has three pulses in a set and the low-order 2 bits of the C2 pointer stored in the register 22 can be obtained by means of the gate circuit 29 as the pointer in common for the data $W_x$, A/$W_x$, B.

When the C2 pointer is obtained as described above, the content of the C2 pointer is checked in the D/A interface circuit 13. Since the data with a C2 pointer set up therefor is error data, it is subjected to interpolation or other treatment.

According to the present invention as described above, by arranging a C2 pointer assigned to 8 bits to be attached to each 8-byte (symbol) data in the C2 correction in the MD mode, the capacity for the C2 pointers can be decreased to ¼ of that in the CD player where 1 byte for the C2 pointer was required for 2-byte data. Therefore, it becomes possible to realize a de-interleave circuit using 32K-bit RAM.

Also, since it has been arranged in the MD mode such that C2 pointers are written at the same address four times over, while, in the CD mode, C2 pointers are written 12 times, for the data of 12 bytes, it is made possible to use an error correcting program in common by the MD mode and the CD mode.

What is claimed is:

1. In a digital data regenerating apparatus for regenerating digital data, while correcting errors in the data, which is formed of a predetermined number of words corresponding to 1 frame and input in parallel, a de-interleave circuit comprising:

a demodulator circuit for demodulating digital data;

a buffer RAM for temporarily storing demodulated output data output from said demodulator circuit;

an error correcting circuit for receiving data from said buffer RAM through an input circuit;

a microprogram sequencer; and a plurality of pointers and a pointer setting circuit for setting said pointers controlled by said microprogram sequencer, wherein each of a plurality of error correcting pointers is set to the same address corresponding to data formed of a plurality of words.

2. A de-interleave circuit according to claim 1, wherein, in a plurality of operating modes in which an error correcting flag is attached to each set of different data, addresses for setting data to said pointers are made different wherein in one mode a plurality of pointers are set to the same address and in another mode said pointers are set to different addresses, such that error correction is achieved by the use of a common microprogram in said plurality of operating modes.

3. The de-interleave circuit according to claim 1, wherein said buffer RAM temporarily stores said pointers each of which correspond to data formed of a plurality of words.

4. The de-interleave circuit according to claim 1, wherein said de-interleave circuit has means for designating operation in a plurality of modes including a CD mode and a MD mode, said plurality of pointers including C1 pointers and C2 pointers, and said pointer setting circuit setting said C2 pointers different in said CD mode from their setting in said MD mode.

5. The de-interleave circuit according to claim 4, wherein said microprogram sequencer executes a common error correcting program in both said CD mode and said MD mode.

6. The de-interleave circuit according to claim 1, wherein said pointer setting circuit incorporates an error correcting circuit interconnected to said demodulated circuit over a local bus, and a pointer processing circuit connected to said local bus.

7. The de-interleave circuit according to claim 6, wherein said pointer processing circuit comprises a plurality of flip/flops having their inputs connected to said local bus, each of said flip/flops having an enable input connected to a signal which enables signals to be read from said local bus into a data input of each of said flip/flops, and a plurality of output buffers connected between outputs of each of said flip/flops and said local bus for allowing signals to be written from said flip/flops onto said local bus.

8. The de-interleave circuit according to claim 1, wherein said pointer setting circuit incorporates a pointer processing circuit having a plurality of registers connected to said buffer RAM for receiving therefrom and storing a low order pointer PL and high order pointer PU, a pair of latch circuits for latching the low order pointer PL and the high order pointer PU respectively, and a matrix circuit interconnected between said registers and said latches.

9. The de-interleave circuit according to claim 8, including a counter for controlling operation of said matrix, and a source of timing pulses for controlling operation of said counter and for simultaneously enabling said registers.

10. A de-interleave circuit according to claim 1, wherein said addresses correspond to addresses in said buffer RAM, and the capacity of said buffer RAM is reduced because a plurality of said pointers share the same addresses.

* * * * *